United States Patent
Lee et al.

(10) Patent No.: US 8,350,608 B2
(45) Date of Patent: Jan. 8, 2013

(54) PHASE LOCKED LOOP CIRCUIT INCLUDING AUTOMATIC FREQUENCY CONTROL CIRCUIT AND OPERATING METHOD THEREOF

(75) Inventors: Hui Dong Lee, Daejeon (KR); Seok Ju Yun, Daejeon (KR); Kwi Dong Kim, Daejeon (KR); Jong-Kee Kwon, Daejeon (KR); Sang-Hyun Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 104 days.

(21) Appl. No.: 12/976,449

(22) Filed: Dec. 22, 2010

(65) Prior Publication Data

US 2012/0056654 A1 Mar. 8, 2012

(30) Foreign Application Priority Data

Sep. 7, 2010 (KR) ........................ 10-2010-0087630

(51) Int. Cl.
*H03L 7/06* (2006.01)
(52) U.S. Cl. ......... 327/158; 327/156; 327/159; 327/161
(58) Field of Classification Search .................. 327/156, 327/158; 331/16
See application file for complete search history.

(56) References Cited

U.S. PATENT DOCUMENTS

| | | | |
|---|---|---|---|
| 7,042,253 B2 | 5/2006 | Su et al. | |
| 7,154,348 B2 * | 12/2006 | Lee et al. | ........................ 331/34 |
| 2008/0048788 A1 | 2/2008 | Yu | |
| 2010/0301910 A1 * | 12/2010 | Hu et al. | ........................ 327/156 |

FOREIGN PATENT DOCUMENTS

| KR | 10-2007-0008252 A | 1/2007 |
|---|---|---|
| KR | 10-2007-0013483 A | 1/2007 |

OTHER PUBLICATIONS

Masafumi Kondou et al., "A 0.3mm² 90-to-770MHz Fractional-N Synthesizer for a Digital TV Tuner", International Solid-State Circuits Conference, Frequency & Clock Synthesis, 2010, pp. 248-250, Session 13, IEEE.

* cited by examiner

*Primary Examiner* — John Poos (57) ABSTRACT

Provided is a PLL circuit including automatic frequency control circuit and an operating method thereof. The voltage controlled oscillator is primarily controlled by an automatic frequency control circuit, and is secondarily controlled by a loop filter. The voltage controlled oscillator outputs a coarsely-tuned oscillation signal when primarily controlled, and outputs a finely-tuned oscillation signal when secondarily controlled. The PLL circuit can have a quick frequency fixing time, and output the oscillation signal having a broad and stable frequency. Moreover, the noise characteristic of the PLL circuit is enhanced.

20 Claims, 9 Drawing Sheets

PHASE LOCKED LOOP CIRCUIT INCLUDING AUTOMATIC FREQUENCY CONTROL CIRCUIT AND OPERATING METHOD THEREOF

CROSS-REFERENCE TO RELATED APPLICATIONS

This U.S. non-provisional patent application claims priority under 35 U.S.C. §119 of Korean Patent Application No. 10-2010-0087630, filed on Sep. 7, 2010, the entire contents of which are hereby incorporated by reference.

BACKGROUND OF THE INVENTION

The present invention disclosed herein relates to a Phase Locked Loop (PLL) circuit, and more particularly, to a PLL circuit including automatic frequency control circuit and an operating method thereof.

When a signal is expressed as a frequency domain, it is divided into a size component representing the intensity of a signal and a phase component representing time characteristic. Since the phase component of the signal is sensitively affected by a temperature or a peripheral circuit, the phase (i.e., frequency) of the signal is easily changed. As an example, the delay of a clock signal may occur according to a signal path in transmitting of a digital signal. When signal delay occurs, since the phase of a signal is changed and thus the start and end of the clock signal is unclear, a circuit for synchronizing the start and end of the clock signal is required.

A PLL circuit is a frequency feedback circuit that stably outputs an arbitrary frequency signal synchronized with the frequency of an external input signal. The PLL circuit is widely used in an analog and digital electronic circuit system. For example, the PLL circuit is used to stably provide the oscillation frequency of a Local Oscillator (LO) for transmitting/receiving of a signal in a wireless communication system, or to generate a stable reference clock signal required for processing of a digital signal in digital circuits such as microprocessors.

Generally, a PLL circuit includes: a phase detector that compares the phase difference between an input reference signal and a feedback oscillation signal to output the compared result; a charge pump that generates a current in response to the output of the phase detector; a loop filter that generates a control voltage according to the output current of the charge pump; and a Voltage Controlled Oscillator (VCO) that generates a signal having an arbitrary frequency in response to the control voltage of the loop filter.

SUMMARY OF THE INVENTION

The present invention provides a Phase Locked Loop (PLL) circuit having a fast response and an operating method thereof.

Embodiments of the present invention provide a Phase Locked Loop (PLL) circuit including: a voltage controlled oscillator including an adjustable capacitor and a capacitor bank, and outputting a signal having an arbitrary frequency; a loop filter outputting a control voltage for controlling a capacitance of the adjustable capacitor; and an automatic frequency control circuit receiving a signal having a reference frequency and a divided signal of an output signal of the voltage controlled oscillator, and generating a control code for controlling a capacitance of the capacitor bank, wherein the voltage controlled oscillator generates an output signal synchronized with a target frequency, according to the capacitance of the adjustable capacitor controlled by the control voltage and the capacitance of the capacitor bank controlled by the control code.

In some embodiments, the automatic frequency control circuit may include: a pulse width generator generating a pulse width signal per set period of an input signal; a pulse width-to-voltage converter converting the generated pulse width signal into a voltage value in response to the generated pulse width signal; a comparator comparing a level of the converted voltage; a control logic generating the control code according to a compared result of the comparator; and a successive approximation register storing the generated control code or temporarily changing the control code, according to control of the control logic.

In other embodiments, the pulse width generator may receive the signal having the reference frequency and the divided signal of the output signal of the voltage controlled oscillator, and activate pulse width signals of the two received signals per set period.

In still other embodiments, the automatic frequency control circuit may further include: a logic gate activating a control signal for operating the comparator according to the pulse width signals of the two received signals.

In even other embodiments, the successive approximation register may include: a register storing the generated control code; and a switch logic temporarily changing the control code.

In yet other embodiments, the pulse width-to-voltage converter may include: a first switch connected between a power source voltage and an output terminal of the pulse width-to-voltage converter, and controlled according to an inverted signal of the generated pulse width signal; a second switch connected between the output terminal and a current source, and controlled according to the generated pulse width signal; and a capacitor connected between the output terminal and a ground, wherein the capacitor is charged with the power source voltage when the first switch is turned on, and when the second switch is turned on, an electric charge charged in the capacitor is discharged through the current source.

In further embodiments, the capacitor bank may include: a plurality of capacitors; and a plurality of switches respectively connected to the capacitors.

In still further embodiments, the switches may respectively disconnect the capacitors from an output terminal of the voltage controlled oscillator or may respectively connect the capacitors to the output terminal of the voltage controlled oscillator, according to the control code.

In other embodiments of the present invention, a Phase Locked Loop (PLL) circuit includes: a voltage controlled oscillator outputting a signal having an arbitrary frequency; a loop filter outputting a control voltage for controlling a frequency of a signal outputted from the voltage controlled oscillator; a regulator supplying a power source voltage to the voltage controlled oscillator; and an automatic frequency control circuit receiving a signal having a reference frequency and a divided signal of an output signal of the voltage controlled oscillator, and generating a control code for controlling the power source voltage outputted from the regulator, wherein the voltage controlled oscillator is primarily controlled by the power source voltage supplied from the regulator, is secondarily controlled by a control voltage of the loop filter, and generates an output signal synchronized with a target frequency.

In some embodiments, the automatic frequency control circuit may include: a pulse width generator generating a pulse width signal per set period of an input signal; a pulse width-to-voltage converter converting the generated pulse width signal into a voltage value in response to the generated pulse width signal; a comparator comparing a level of the converted voltage; a control logic generating the control code according to the compared result of the comparator; and a successive approximation register storing the generated control code or temporarily changing the control code, according to control of the control logic.

In other embodiments, the pulse width generator may receive the signal having the reference frequency and the divided signal of the output signal of the voltage controlled oscillator, and activate pulse width signals of the two received signals per set period.

In still other embodiments, the automatic frequency control circuit may further include: a logic gate activating a control signal for operating the comparator according to the pulse width signals of the two received signals.

In even other embodiments, the successive approximation register may include: a register storing the generated control code; and a switch logic temporarily changing the control code.

In yet other embodiments, the pulse width-to-voltage converter may include: a first switch connected between a power source voltage and an output terminal of the pulse width-to-voltage converter, and controlled according to an inverted signal of the generated pulse width signal; a second switch connected between the output terminal and a current source, and controlled according to the generated pulse width signal; and a capacitor connected between the output terminal and a ground, wherein the capacitor is charged with the power source voltage when the first switch is turned on, and when the second switch is turned on, an electric charge charged in the capacitor is discharged through the current source.

In still other embodiments of the present invention, an operating method of a Phase Locked Loop (PLL) circuit includes: receiving a signal having a reference frequency and an output signal of a voltage controlled oscillator, and generating pulse width signals of the two received signals; converting the generated pulse width signals into voltage signals, respectively; comparing levels of the converted voltage signals; generating a control code according to the compared result; receiving the signal having the reference frequency and the output signal of the voltage controlled oscillator, and generating a control voltage according to a phase difference between the two received signals; and generating an output signal synchronized with a target frequency, in response to the control code and the control voltage.

In some embodiments, the generating of an output signal may determine a load capacitance of the voltage controlled oscillator according to a capacitance controlled by the control code and a capacitance controlled by the control voltage, and generate the output signal synchronized with the target frequency according to the load capacitance.

In other embodiments, the generating of pulse width signals may generate activated signals per set periods of the two received signals, respectively.

In still other embodiments, the converting of the generated pulse width signals may output a power source voltage during a deactivated section of the pulse width signal, and output a voltage which decreases at a certain speed during an activated section of the pulse width signal.

In even other embodiments, the generating of a control code may include: generating a temporary control code for temporarily setting a capacitance; and changing the temporary control code according to the compared result in the comparing of levels.

In yet other embodiments, the generating of a control code may sequentially generate the control code by one bit.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the drawings, exemplary embodiments of the inventive concept are not limited to specific forms and are exaggerated for clarity. The terminology used herein is for the purpose of describing particular embodiments only and is not intended to be limiting of example embodiments. Moreover, it will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the present invention will be described in detail with reference to the accompanying drawings.

Figure 1:
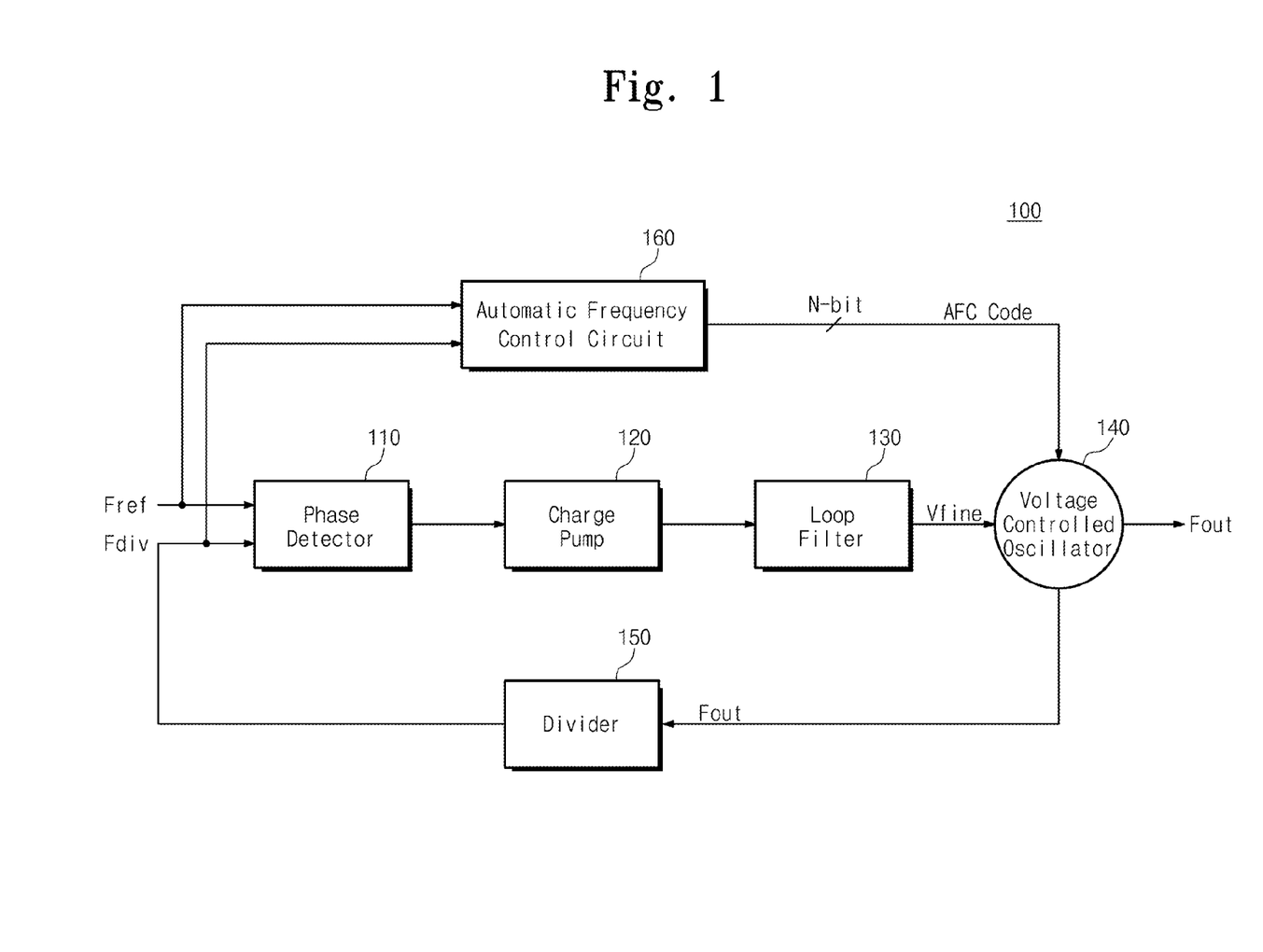
FIG. 1 is a block diagram exemplarily illustrating a Phase Locked Loop (PLL) circuit according to a first embodiment of the present invention.

FIG. 1 is a block diagram exemplarily illustrating a Phase Locked Loop (PLL) circuit according to a first embodiment of the present invention.

Referring to FIG. 1, a PLL circuit 100 according to a first embodiment of the present invention includes a phase detector 110, a charge pump 120, a loop filter 130, a voltage controlled oscillator 140, a divider 150, and an automatic frequency control circuit 160.

The phase detector 110, the charge pump 120, the loop filter 130 and the voltage controlled oscillator 140 are connected in series. The divider 150 is connected between the voltage controlled oscillator 140 and the phase detector 110 and forms a feedback loop. The automatic frequency control circuit 160 is connected to the voltage controlled oscillator 140.

The phase detector 110, the charge pump 20, the loop filter 130 and the divider 150 are devices that have been known to those skilled in the art. Therefore, the phase detector 110, the charge pump 20, the loop filter 130 and the divider 150 will be described below in brief.

The phase detector 110 receives a signal (hereinafter referred to as a reference frequency signal Fref) having a reference frequency. The reference frequency signal Fref inputted to the phase detector 110 may be provided from a crystal oscillator (not shown). Also, the phase detector 110 receives a divided oscillation signal Fdiv through the divider 150. The phase detector 110 detects a phase or frequency difference between the reference frequency signal Fref and the divided oscillation signal Fdiv.

The charge pump 120 generates an electric charge or a current in response to the output of the phase detector 110. For example, the charge pump 120 sinks a current when the frequency of the divided oscillation signal Fdiv is higher than that of the reference frequency signal Fref. As another example, the charge pump 120 sources a current when the frequency of the divided oscillation signal Fdiv is lower than that of the reference frequency signal Fref.

The loop filter 130 includes a capacitor. The capacitor of the loop filter 130 is charged or discharged according to the output of the charge pump 120. The loop filter 130 generates a voltage Vfine according the amount of an electric charge that is charged in or discharged from the capacitor. For example, the loop filter 130 generates a low voltage when a current is sunk from the charge pump 120. The loop filter 130 generates a high voltage when a current is sourced from the charge pump 120. The loop filter 130 may be a low pass filter for filtering the high frequency component of a signal outputted from the charge pump 120.

In response to the output voltage Vfine of the loop filter 130, the voltage controlled oscillator 140 generates an oscillation signal Fout having a frequency corresponding to the output voltage Vfine. The divider 150 decreases the frequency of the oscillation signal Fout, which is outputted from the voltage controlled oscillator 140, by a dividing ratio. The divider 150 provides the frequency-decreased oscillation signal Fout, i.e., the divided oscillation signal Fdiv to the phase detector 110.

The voltage controlled oscillator 140 generates the oscillation signal Fout having an arbitrary frequency in response to an input voltage Vfine. When the gain of the voltage controlled oscillator 140 is large, the PLL circuit 100 may output a signal having a broad frequency. However, when the gain of the voltage controlled oscillator 140 is large, the jitter characteristic of the output signal of the PLL circuit 100 may become worse because the PLL circuit 100 is vulnerable to noise.

The PLL circuit 100 according to a first embodiment of the present invention includes a capacitor bank for outputting the oscillation signal Fout having a broad frequency. The capacitor bank may be included in the voltage controlled oscillator 140. The PLL circuit 100 including the capacitor bank includes the automatic frequency control circuit 160, for outputting the oscillation signal Fout having a stable frequency even when the frequency of the input reference frequency signal Fref is changed.

The automatic frequency control circuit 160 receives the reference frequency signal Fref and the divided oscillation signal Fdiv, and outputs a digital code of at least one bit or more (N-bit). Such a digital code is defined as an Automatic Frequency Control (AFC) code. The AFC code is provided to the voltage controlled oscillator 140.

According to a first embodiment of the present invention, the voltage controlled oscillator 140 is primarily controlled by the AFC code, and is secondarily controlled by the output voltage Vfine of the loop filter 130. The voltage controlled oscillator 140 outputs a coarsely-tuned oscillation signal Fout when primarily controlled, and outputs a finely-tuned oscillation signal Fout when secondarily controlled. Accordingly, the PLL circuit 100 can have a quick frequency fixing time, and output the oscillation signal Fout having a broad and stable frequency.

Figure 2:
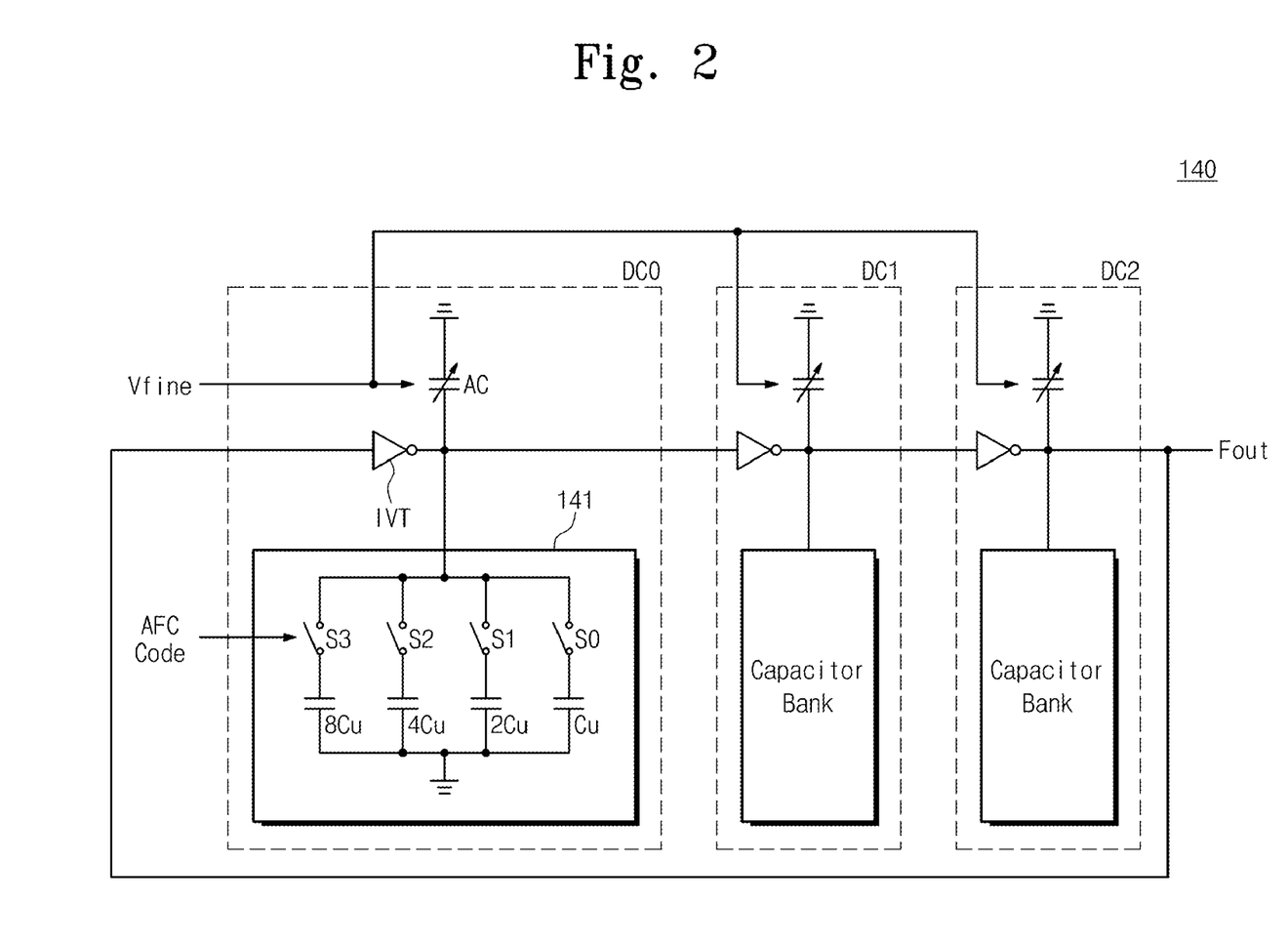
FIG. 2 is a block diagram exemplarily illustrating a voltage controlled oscillator of the PLL circuit of FIG. 1.

FIG. 2 is a block diagram exemplarily illustrating the voltage controlled oscillator of the PLL circuit of FIG. 1.

Referring to FIGS. 1 and 2, the voltage controlled oscillator 140 includes a plurality of delay cells DC0 to DC2. The respective delay cells have the same configuration. Therefore, for briefness, the voltage controlled oscillator 140 will be described below with reference to one delay cell DC0. FIG. 2 illustrates a 3-stage voltage controlled oscillator including three delay cells DC0 to DC2, but the number of delay cells is not limited thereto. Moreover, FIG. 2 illustrates a single type of delay cell, but it can be well understood that the voltage controlled oscillator 140 may include a differential type of delay cell.

The delay cell DC0 includes an adjustable capacitor AC, an inverter IVT, and a capacitor bank 141. The capacitor bank 141 may include a plurality of capacitors. The capacitor bank 141 may include a plurality of switches that are respectively connected to capacitors. In FIG. 2, for example, the capacitor bank 141 includes four capacitors Cu, 2Cu, 4Cu and 8Cu, and switches S0 to S3. Herein, Cu indicates a unit capacitance value.

The inverter IVT is connected to the output terminal of the voltage controlled oscillator 140 outputting the oscillation signal Fout. The capacitors Cu, 2Cu, 4Cu and 8Cu are connected to the output terminal of the inverter IVT in parallel. The switches S0 to S3 is connected between the inverter IVT and the capacitors Cu, 2Cu, 4Cu and 8Cu so as to be in correspondence, respectively.

The frequency of the oscillation signal Fout outputted from the voltage controlled oscillator 140 is controlled by a load capacitance. The load capacitance is determined according to the capacitance of the capacitor bank 141 and the capacitance of the adjustable capacitor AC. That is, the frequency of the oscillation signal Fout outputted from the voltage controlled oscillator 140 is controlled by the capacitance of the capacitor bank 141 and the capacitance of the adjustable capacitor AC.

The capacitance of the capacitor 141 is controlled by the AFC code of the automatic frequency control circuit 160. The capacitance of the adjustable capacitor AC is controlled by the output voltage Vfine of the loop filter 130. That is, the voltage controlled oscillator 140 according to an embodiment of the present invention outputs the oscillation signal Fout in response to the AFC code of the automatic frequency control circuit 160 and the output voltage Vfine of the loop filter 130.

The capacitance of the capacitor bank 141 is determined according to the connection states of the switches S0 to S3. The connection states of the switches S0 to S3 are determined by the AFC code provided from the automatic frequency control circuit 160. The number of bits of the AFC code provided from the automatic frequency control circuit 160 may be determined according to the number of capacitors included in the capacitor bank 141. For example, in FIG. 2, the capacitor bank 141 exemplarily includes the four capacitors Cu, 2Cu, 4Cu and 8Cu, and thus the AFC code may be configured as a 4-bit code.

The capacitance of the adjustable capacitor AC is determined by the output voltage Vfine of the loop filter 130. The adjustable capacitor AC may be configured with a device having a variable capacitance, for example, a varactor. The capacitance of the adjustable capacitor AC is determined by the output voltage Vfine of the loop filter 130 after the capacitance of the capacitor bank 141 is determined.

The capacitor bank 141 according to an embodiment of the present invention includes a plurality of capacitors. However, the capacitor bank 141 is not limited thereto. For example, in an LC oscillator, the capacitor bank 141 may include a plurality of inductors. When the capacitor bank 141 is configured with an inductor, the frequency of the oscillation signal Fout outputted from the voltage controlled oscillator 140 may be controlled by the inductance of the capacitor bank 141. The inductance of the capacitor bank 141 may be determined by the AFC code.

Figure 3:
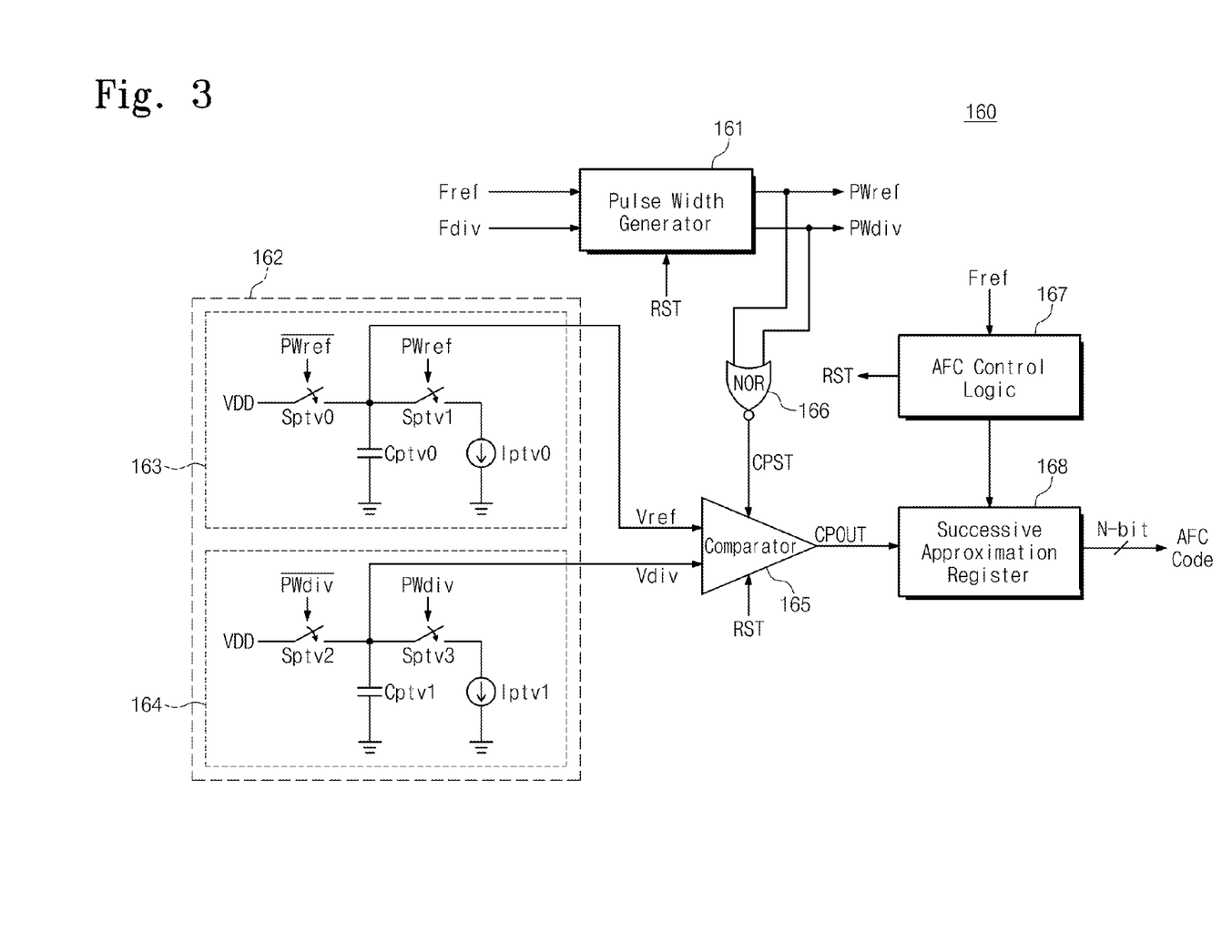
FIG. 3 is a block diagram exemplarily illustrating an automatic frequency control circuit of the PLL circuit of FIG. 1.

FIG. 3 is a block diagram exemplarily illustrating the automatic frequency control circuit of the PLL circuit of FIG. 1.

Referring to FIG. 3, the automatic frequency control circuit 160 includes a pulse width generator 161, a pulse width-to-voltage converter 162, a comparator 165, a NOR gate 166, an AFC control logic 167, and a successive approximation register 168. The successive approximation register 168 may include a register (not shown) for storing the output value of the comparator 165, and a switch logic (not shown) for controlling the capacitance of the capacitor bank 141 (see FIG. 2).

The automatic frequency control circuit 160 receives the reference frequency signal Fref and the divided oscillation signal Fdiv. The automatic frequency control circuit 160 determines whether the frequency of the reference frequency signal Fref is faster than that of the divided oscillation signal Fdiv through the comparator 163. The automatic frequency control circuit 160 generates the AFC code for controlling the switches of the capacitor bank 141 (see FIG. 2) according to the determined result.

For determining whether the frequency of the reference frequency signal Fref is faster than that of the divided oscillation signal Fdiv, the reference frequency signal Fref and the divided oscillation signal Fdiv are converted into voltage values, respectively. For converting the reference frequency signal Fref and the divided oscillation signal Fdiv into the voltage values, the pulse width generator 161 and the pulse width-to-voltage converter 162 are used.

The pulse width generator 161 receives the reference frequency signal Fref and the divided oscillation signal Fdiv. The pulse width generator 161 generates the pulse width signal of the reference frequency signal Fref and the pulse width signal of the divided oscillation signal Fdiv. For example, the pulse width generator 161 may activate the respective pulse width signals during the predetermined period of the reference frequency signal Fref and the predetermined period of the divided oscillation signal Fdiv (for example, allowing the respective pulse width signals to logic high values).

According to a first embodiment of the present invention, the pulse width signals PWref and PWdiv have pulse widths corresponding to the two periods of the reference frequency signal Fref and divided oscillation signal Fdiv, respectively. However, setting of periods for the reference frequency signal Fref and divided oscillation signal Fdiv for generating pulse width signals is not limited thereto. Setting of periods for the reference frequency signal Fref and divided oscillation signal Fdiv for generating pulse width signals may be changed according to the frequencies of the respective signals.

The pulse width voltage converter 162 converts the input pulse width signals PWref and PWdiv into voltage values, respectively. The pulse width voltage converter 162 includes a first pulse width-to-voltage converter 163 for converting the pulse width signal PWref of the reference frequency signal Fref into a voltage value, and a second pulse width-to-voltage converter 164 for converting the pulse width signal PWdiv of the divided oscillation signal Fdiv into a voltage value. Since the configuration and operation of the first and second pulse width-to-voltage converters 163 and 164 are the same, the configuration and operation of the first pulse width-to-voltage converter 163 will be described below as a representative example.

The first pulse width-to-voltage converter 163 includes switches Sptv0 and Sptv1, a capacitor Cptv0, and a current source Ipvt0. The switches Sptv0 and Sptv1 are turned off in response to a control signal having a logical low value, and are turned on in response to a control signal having a logical high value. In response to a deactivated pulse width signal PWref (for example, having a logical low value), the capacitor Cptv0 is charged with a power source voltage VDD. In response to an activated pulse width signal PWref (for example, having a logical high value), the switch Sptv0 is turned off, but the switch Sptv1 is turned on. In response to the activated pulse width signal PWref (for example, having a logical high value), the power source voltage charged in the capacitor Cptv0 is discharged with at a certain speed through the current source Ipvt0.

The capacitor Cptv0 is charged or discharged in response to the pulse width signal PWref inputted. Therefore, the output voltage Vref of the first pulse width-to-voltage converter 163 is determined. For example, when the pulse width signal PWref is deactivated (for example, in a case of having a logical low value), the capacitor Cptv0 is charged. Accordingly, the output voltage Vref may have the same level as that of the power source voltage VDD. On the other hand, when the pulse width signal PWref is activated (for example, in a case of having a logical high value), the capacitor Cptv0 is discharged. Thus, the output voltage Vref becomes lower. The output voltage Vref may become lower in proportion to the length of a section in which the pulse width signal PWref is activated (for example, a logical high value).

The comparator 165 receives the voltage Vref of the reference frequency signal and the voltage Vdiv of the divided oscillation signal. The comparing operation of the comparator 165 may be performed one time per eight periods of the reference frequency signal Fref and divided oscillation signal Fdiv. The comparator 165 performs the comparing operation in response to the activated control signal CPST of the NOR gate 166. For example, the NOR gate 166 outputs the activated control signal CPST (for example, having a logical high value) when the pulse width signals PWref and PWdiv have logical low values. The comparator 165 performs the comparing operation in response to the rising edge of the activated control signal CPST (for example, having a logical high value).

The output signal CPOUT of the comparator 165 denotes a fast frequency among the frequencies of the reference frequency signal Fref and divided oscillation signal Fdiv. For example, when the output signal CPOUT of the comparator 165 has a logical high value, it denotes that the frequency of the divided oscillation signal Fdiv is slower than that of the reference frequency signal Fref. On the other hand, when the output signal CPOUT of the comparator 165 has a logical low value, it denotes that the frequency of the divided oscillation signal Fdiv is faster than that of the reference frequency signal Fref. The output signal CPOUT of the comparator 165 is stored in the successive approximation register 168.

The AFC control logic 167 controls the successive approximation register 168 and performs a successive approximation algorithm. Herein, the successive approximation algorithm is an algorithm that searches sequentially from the Most Significant Bit (MSB) of an AFC code to the Least Significant Bit (LSB) to determine the AFC code. The operations of the AFC control logic 167 and successive approximation register 168 will be described below in detail with reference to FIGS. 2 to 4.

Figure 4:
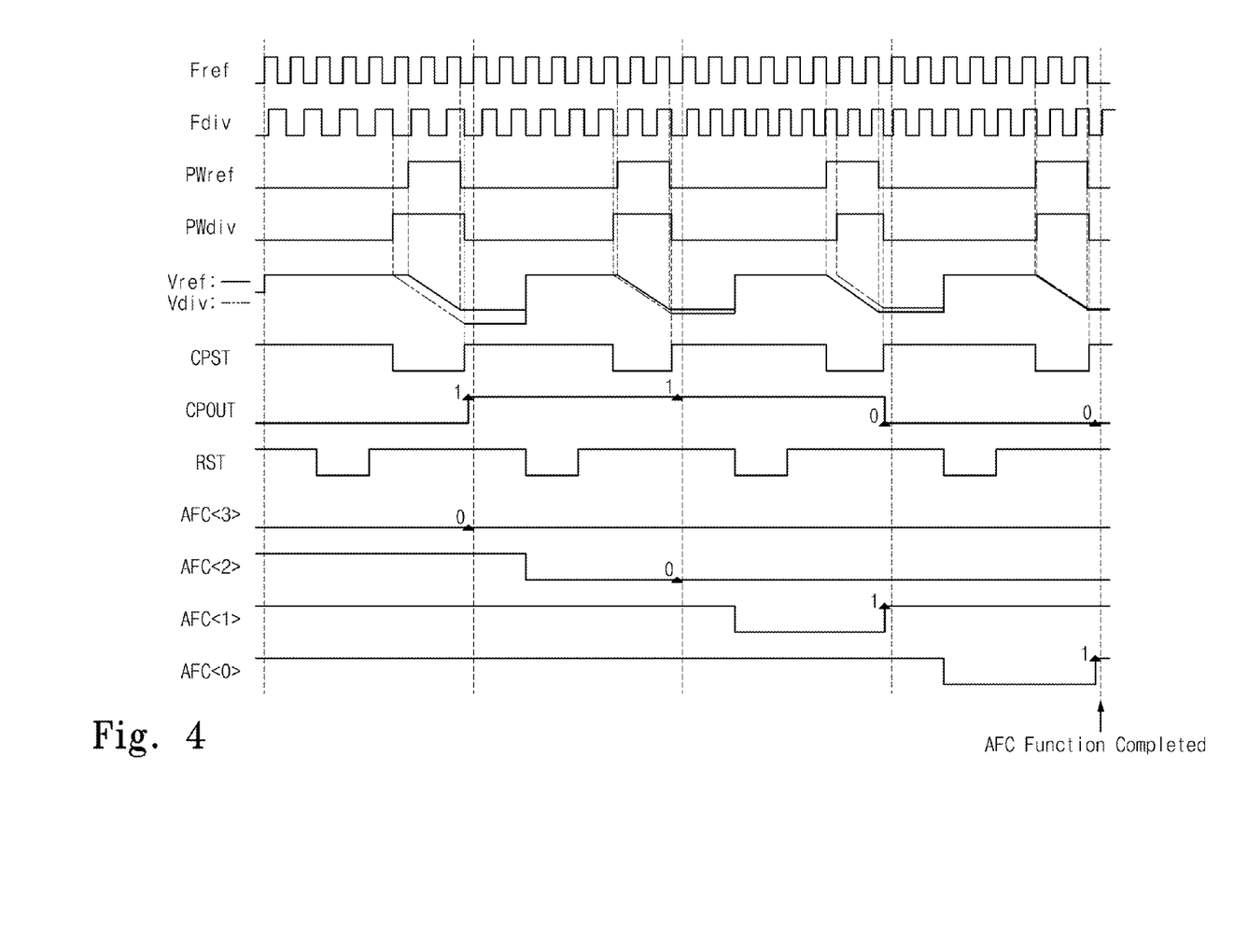
FIG. 4 is a timing diagram for describing an operation of the automatic frequency control circuit which is illustrated in FIG. 3.

FIG. 4 is a timing diagram for describing an operation of the automatic frequency control circuit which is illustrated in FIG. 3.

Referring to FIGS. 2 to 4, the AFC control logic 167 performs a successive approximation algorithm for generating an AFC code. The successive approximation algorithm according to a first embodiment of the present invention is an algorithm that determines the capacitance of the capacitor bank 141 in order for the frequency of the divided oscillation signal Fdiv to coarsely be synchronized with the frequency of the reference frequency signal Fref.

Exemplarily, the AFC control logic 167 searches each bit from the MSB of the AFC code to the LSB according to the successive approximation algorithm. According to a first embodiment of the present invention, the bits of the AFC code are value for determining the connection states of the switches S3 to S0. Therefore, the AFC control logic 167 connects the switches S3 to S0 one by one and performs search in order for the capacitance of the capacitor bank 141 to be optimized.

According to a first embodiment of the present invention, the capacitor bank 141 is configured with the four capacitors Cu, 2Cu, 4Cu and 8Cu, and thus the AFC control logic 167 determines a 4-bit AFC code. The number of bits of the AFC code may also vary according to the number of capacitors configuring the capacitor bank 141. Each of the bits of the AFC code is determined in the same scheme according to the successive approximation algorithm. Thus, an operation of determining the value of the MSB (i.e., AFC<3>) of the AFC code will be described below as an example.

The AFC control logic 167 compulsorily determines an initial AFC code outputted from the successive approximation register 168. For example, the AFC control logic 167 stores data "0111" in the successive approximation register 168. In response to this, the successive approximation register 168 outputs an AFC code "0111". When the AFC code "0111" is outputted, the capacitor 8Cu is disconnected, and the other capacitors Cu, 2Cu and 4Cu are connected. For determining the connection or disconnection of the switch S3, that is, the AFC control logic 167 controls the successive approximation register 168 in order to output an AFC code of connecting the other switches S2 to S0.

The voltage controlled oscillator 140 generates an oscillation signal Fout in response to an AFC code for determining the MSB (AFC<3>). The generated oscillation signal Fout is divided and provided to the pulse width generator 161. The pulse width generator 161 generates the pulse width signal PWref of the reference frequency signal Fref and the pulse width signal PWdiv of the divided oscillation signal Fdiv. The pulse width-to-voltage converter 162 converts the pulse width signals PWref and PWdiv into voltage values, respectively.

In response to the control signal CPST of the NOR gate 166, i.e., a comparison operation signal, the comparator 165 compares the voltage Vref of the reference frequency signal Fref and the voltage Vdiv of the divided oscillation signal Fdiv and outputs the compared result CPOUT. For example, the comparator 165 outputs the compared result CPOUT having a logical high value when the voltage Vref of the reference frequency signal Fref is greater than the voltage Vdiv of the divided oscillation signal Fdiv. On the other hand, the comparator 165 outputs the compared result CPOUT having a logical low value when the voltage Vref of the reference frequency signal Fref is less than the voltage Vdiv of the divided oscillation signal Fdiv.

The AFC control logic 167 determines the MSB (AFC<3>) of the AFC code in response to the output CPOUT of the comparator 165. When the output CPOUT of the comparator 165 has a logical high value, the AFC control logic 167 maintains the value of the MSB (AFC<3>) of the AFC code, which is stored in the successive approximation register 168, as an initially-set value (i.e., data "0"). On the other hand, when the output CPOUT of the comparator 165 has a logical low value, the AFC control logic 167 inverts the value of the MSB (AFC<3>) of the AFC code stored in the successive approximation register 168. In FIG. 4, since the output CPOUT of the comparator 165 has a logical high value, the AFC control logic 167 maintains the value of MSB (AFC<3>) of the AFC code as the initially-set value (i.e., data "0"). Subsequently, the AFC control logic 167 outputs a reset signal RST to initialize the pulse width generator 161 and the comparator 165.

Herein, when the output CPOUT of the comparator 165 has a logical high value, this denotes that the frequency of the reference frequency signal Fref is faster than that of the divided oscillation signal Fdiv. Since the frequency of the divided oscillation signal Fdiv becomes faster in inverse proportion to the capacitance of the capacitor bank 141, the AFC control logic 167 sets an AFC code in order for the capacitance of the capacitor bank 141 to become lower. Therefore, the AFC control logic 167 sets the value of the MSB (AFC<3>) of the AFC code in order for the capacitor 8Cu to be disconnected.

The AFC control logic 167 determines the bit values of the AFC code in the same scheme. While the bit values of the AFC code are being determined, the AFC control logic 167 stores the previously-determined upper bit values of the AFC code in the successive approximation register 168 and continuously maintains the values. The AFC control logic 167 provides the finally-determined AFC code to the voltage controlled oscillator 140 when the value of the LSB (AFC<0>) of the AFC code is determined.

Figure 5:
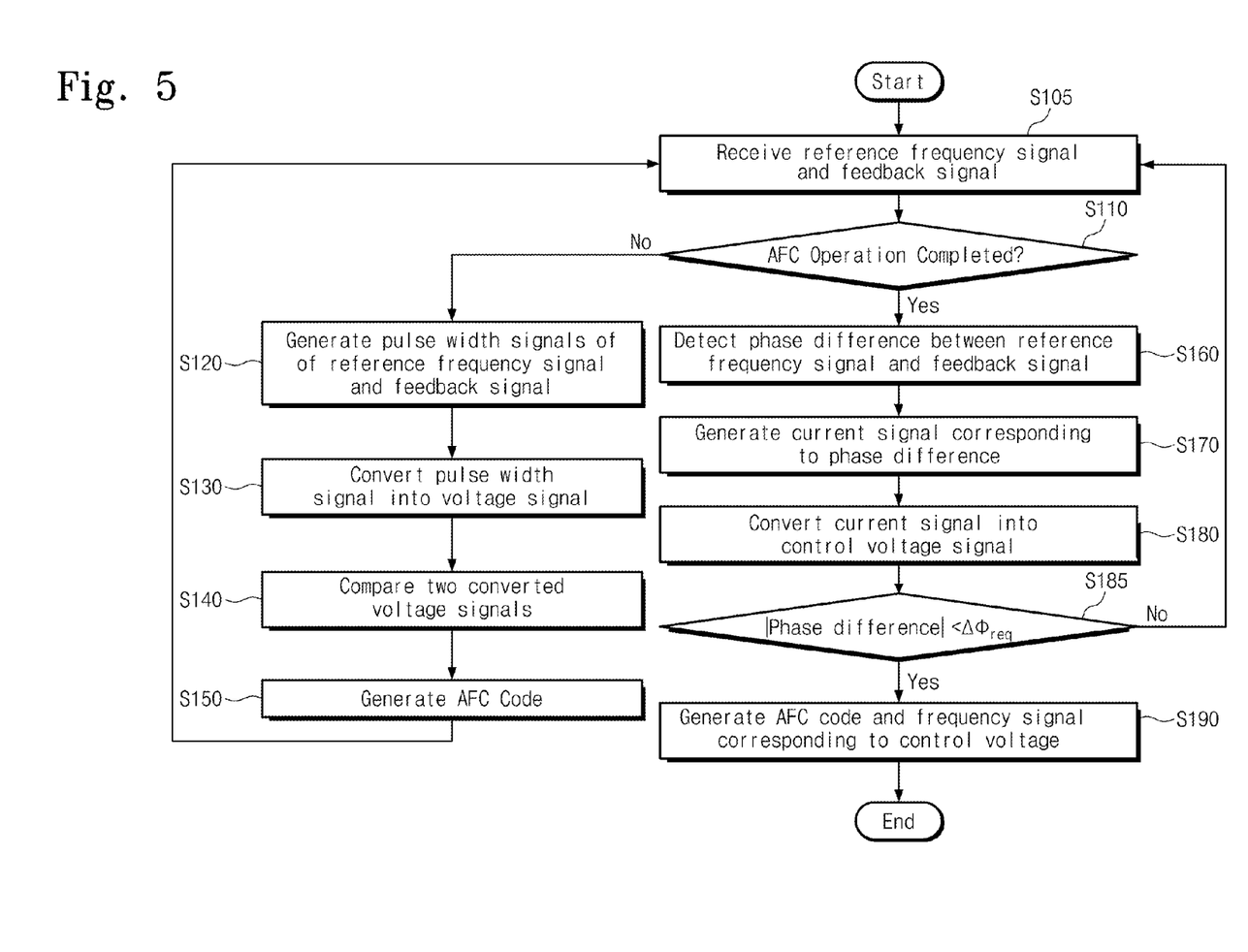
FIG. 5 is a flowchart illustrating an operation of a PLL circuit according to an embodiment of the present invention.

FIG. 5 is a flowchart illustrating an operation of a PLL circuit according to an embodiment of the present invention. The operation of the PLL circuit will be described below in detail with reference to FIGS. 1 and 3.

The PLL circuit 100 receives the reference frequency signal Fref and a feedback signal in operation S105. Herein, the feedback signal may be the divided oscillation signal Fdiv. The reference frequency signal Fref and the divided oscillation signal Fdiv are inputted to the phase detector 110 and the automatic frequency control circuit 160, respectively.

The operation order of the PLL circuit 100 is divided according to whether the automatic frequency control circuit 160 generates an automatic frequency control code (AFC code) in operation S110. That is, when an automatic frequency control operation is not completed, the PLL circuit 100 performs an AFC code generating operation. When the automatic frequency control operation is completed, the PLL circuit 100 performs a control voltage signal generating operation for controlling the oscillation of the voltage controlled oscillator 140. Herein, the control voltage signal may be fixed to an arbitrary Direct Current (DC) voltage value in generating of the AFC code.

The automatic frequency control circuit 160 receives the reference frequency signal Fref and the divided oscillation signal Fdiv to generate the AFC code. The automatic frequency control circuit 160 may include the pulse width generator 161 for generating the AFC code, the pulse width-to-voltage converter 162, the comparator 165, and the AFC control logic 167.

The pulse width generator 161 generates the pulse width signal of the reference frequency signal Fref and the pulse width signal of the divided oscillation signal Fdiv in operation S120. The pulse width-to-voltage converter 162 converts the pulse width signals PWref and PWdiv into voltage signals, respectively in operation S130. The comparator 165 compares the levels of the voltage signals Vref and Vdiv provided from the pulse width-to-voltage converter 162, and outputs the compared result in operation S140. The compared result of the comparator 165 indicates whether the frequency of the reference frequency signal Fref is faster than that of the divided oscillation signal Fdiv. The AFC control logic 167 generates the AFC code according to the compared result provided from the comparator 165 in operation S150.

The PLL circuit 100 performs the control voltage signal generating operation for controlling the oscillation of the voltage controlled oscillator 140 after generation of the AFC code. The phase detector 110 detects the phase or frequency difference between the reference frequency signal Fref and the divided oscillation signal Fdiv in operation S160. The charge pump 120 generates or sinks a current in response to the output of the phase detector 110 in operation S170. The loop filter 130 generates the voltage signal Vfine in response to a current signal provided from the charge pump 120 in operation S180. The voltage signal Vfine provided from the loop filter 130 is provided as a control voltage signal for controlling the oscillation of the voltage controlled oscillator 140.

The operation order of the PLL circuit 100 is divided according to whether the phase or frequency difference between the reference frequency signal Fref and the divided oscillation signal Fdiv is within a desired error range (ΔΦreq) in operation S185. When the phase or frequency difference between the reference frequency signal Fref and the divided oscillation signal Fdiv is within the desired error range (ΔΦ req), the PLL circuit 100 generates the AFC code, and generates the oscillation signal Fout in response to the control voltage signal Vfine in operation S190.

When the phase or frequency difference between the reference frequency signal Fref and the divided oscillation signal Fdiv is not within the desired error range (ΔΦ req), the PLL circuit 100 returns to operation S105 and regenerates an AFC code and a control voltage signal Vfine.

According to a first embodiment of the present invention, the voltage controlled oscillator 140 outputs a coarsely-tuned oscillation signal Fout in response to the AFC code, and outputs a finely-tuned oscillation signal Fout in response to the control voltage signal Vfine. Therefore, the PLL circuit 100 can output an oscillation signal having a quick frequency fixing time and a broad and stable frequency. Also, even when the frequency of a reference frequency signal is changed, a frequency can be fixed by the operation of the automatic frequency control circuit 160 irrespective of the dividing ratio of the divider 150.

Figure 6:
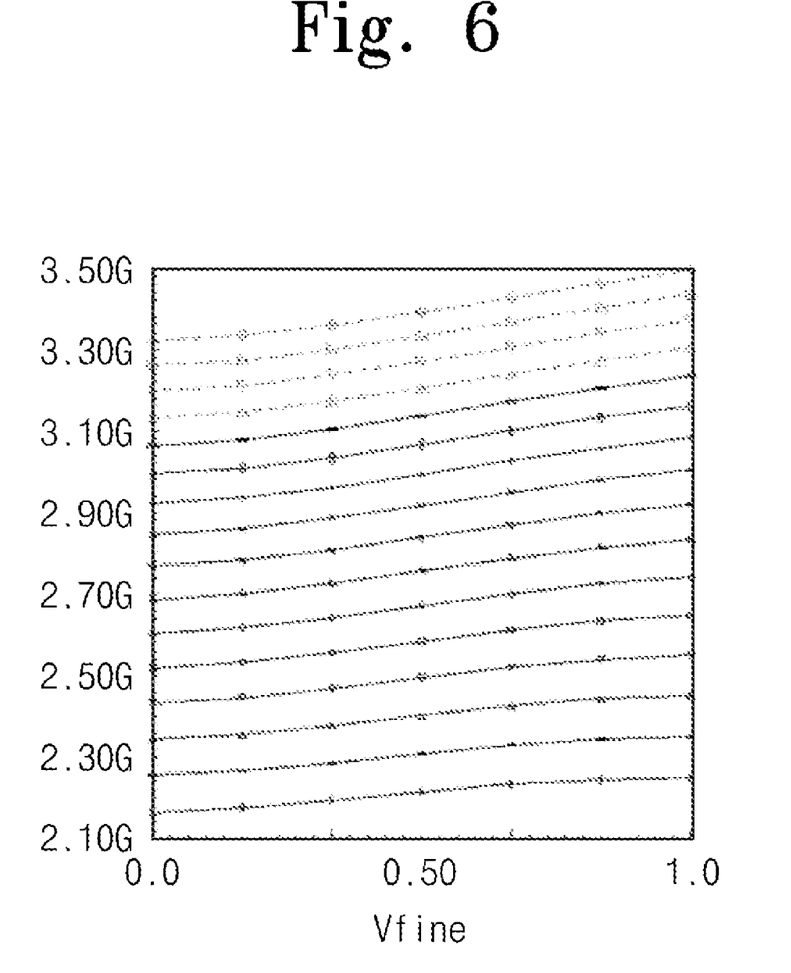
FIG. 6 is a characteristic curve exemplarily showing oscillation frequency characteristic of a PLL circuit according to a first embodiment of the present invention.

FIG. 6 is a characteristic curve exemplarily showing oscillation frequency characteristic of a PLL circuit according to a first embodiment of the present invention.

Referring to FIG. 6, respective curves from the top to the bottom indicate the frequencies of the oscillation signal Fout of the PLL circuit 100 when AFC codes are "0000", "0001", ..., "111", respectively. One curve is selected by an AFC code, i.e., the frequency of the oscillation signal Fout is coarsely selected, and the frequency of the oscillation signal Fout is determined by the control voltage signal provided from the loop filter 130.

Figure 7:
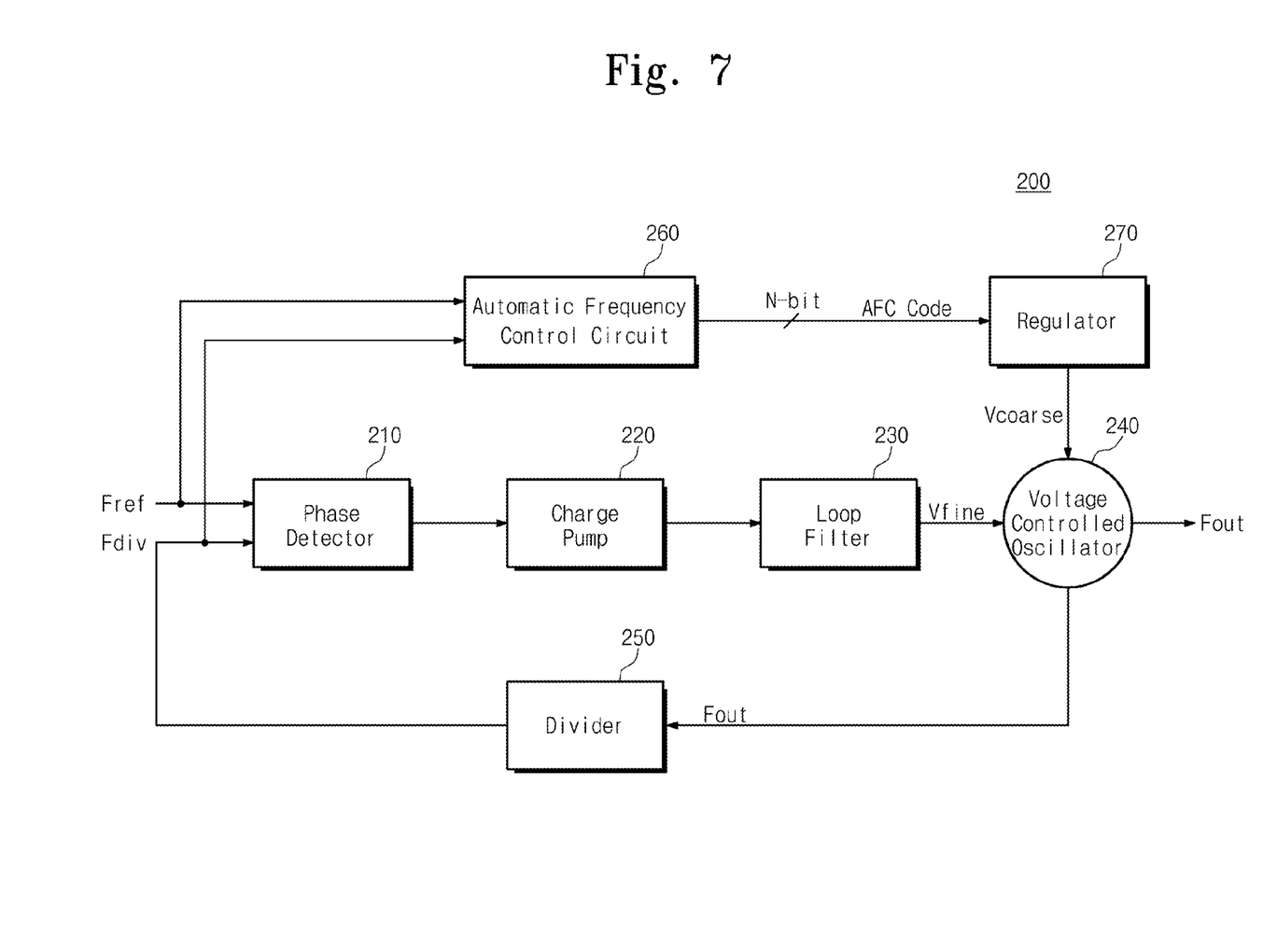
FIG. 7 is a block diagram exemplarily illustrating a PLL circuit according to a second embodiment of the present invention.

FIG. 7 is a block diagram exemplarily illustrating a PLL circuit according to a second embodiment of the present invention.

Referring to FIG. 7, a PLL circuit 200 according to a second embodiment of the present invention includes a phase detector 210, a charge pump 220, a loop filter 230, a voltage controlled oscillator 240, a divider 250, an automatic frequency control circuit 260, and a regulator 270. Except for the automatic frequency control circuit 260 and the regulator 270, the functions and operations of the respective elements are the same as the described of a first embodiment of the present invention.

The frequency of the oscillation signal Fout outputted from the voltage controlled oscillator 240 is determined as expressed in Equation (1) below.

$$f_{osc} = \frac{\eta I_D}{2NC_L V_{DD}} \quad (1)$$

According to Equation (1), the frequency of the oscillation signal Fout outputted from the voltage controlled oscillator 240 is inversely proportional to a power source voltage VDD. That is, the frequency of the oscillation signal Fout outputted from the voltage controlled oscillator 240 may be changed according to the power source voltage VDD.

The regulator 270 generates an output voltage Vcoarse in response to an AFC code provided from the automatic frequency control circuit 260. The voltage controlled oscillator 240 outputs an oscillation signal Fout in response to the output voltage Vcoarse of the regulator 270.

The voltage controlled generator 240 according to a second embodiment of the present invention is primarily controlled by the output voltage Vcoarse of the regulator 270, and is secondarily controlled by the output voltage Vfine of the loop filter 230. The voltage controlled oscillator 240 outputs a coarsely-tuned oscillation signal Fout when primarily controlled, and outputs a finely-tuned oscillation signal Fout when secondarily controlled.

The automatic frequency control circuit 260 generates an AFC code for controlling the output voltage of the regulator 270. The automatic frequency control circuit 260 executes a successive approximation algorithm for generating the AFC code. The successive approximation algorithm according to a second embodiment of the present invention may be an algorithm that determines the output voltage Vcoarse of the regulator 270 in order for the frequency of a divided oscillation signal Fdiv to coarsely be synchronized with the frequency of a reference frequency signal Fref.

According to a second embodiment of the present invention, the PLL circuit 200 can output an oscillation signal having a quick frequency fixing time and a broad and stable frequency. Also, even when the frequency of a reference frequency signal is changed, a frequency can be fixed by the operation of the automatic frequency control circuit 260 irrespective of the dividing ratio of the divider 250.

Figure 8:
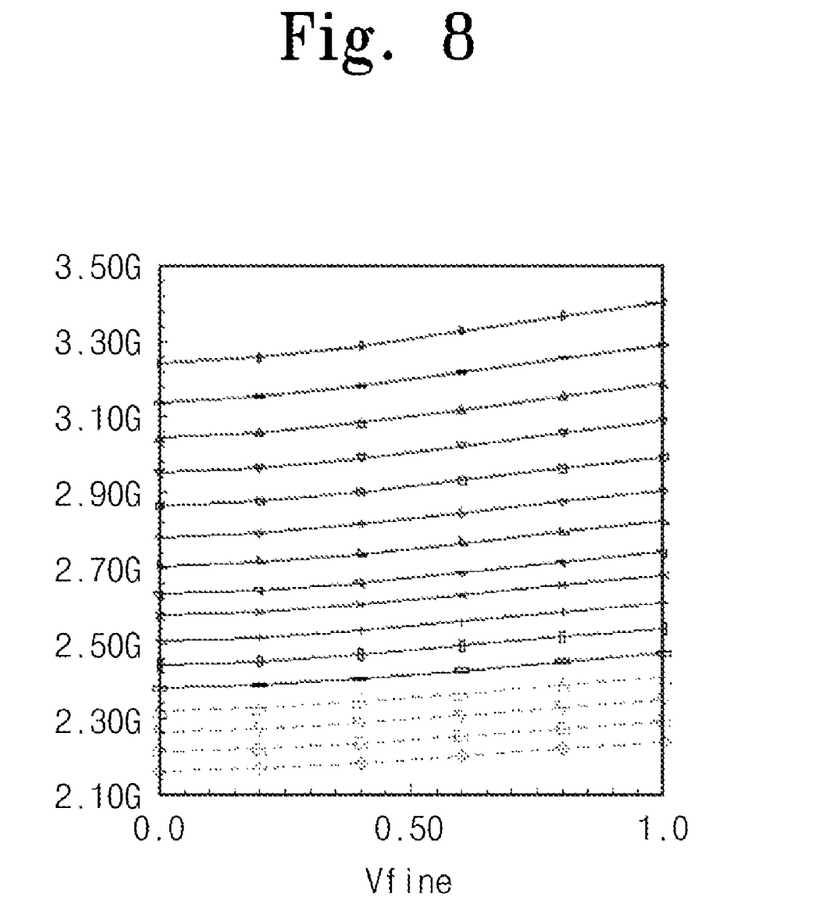
FIG. 8 is a characteristic curve exemplarily showing oscillation frequency characteristic of a PLL circuit according to a second embodiment of the present invention.

FIG. 8 is a characteristic curve exemplarily showing oscillation frequency characteristic of a PLL circuit according to a second embodiment of the present invention.

Referring to FIGS. 7 and 8, the uppermost curve indicates the frequency of the oscillation signal Fout of the PLL circuit 200 when the regulator 270 outputs the power source voltage VDD as the output voltage Vcoarse. The lowermost curve indicates the frequency of the oscillation signal Fout of the PLL circuit 200 when the regulator 270 outputs "the power source voltage VDD−0.75V" as the output voltage Vcoarse. Curves between the uppermost and lowermost curves indicate the frequencies of the oscillation signal Fout of the PLL circuit 200 when the output voltage Vcoarse of the regulator 270 is reduced by 0.05V, respectively.

AFC codes for the respective curves are "0000", "0001", . . . , "111" in the order from the top to the bottom, respectively. One curve is selected by an AFC code, i.e., the frequency of the oscillation signal Fout is coarsely selected, and the frequency of the oscillation signal Fout is determined by the control voltage signal provided from the loop filter 230.

Figure 9:
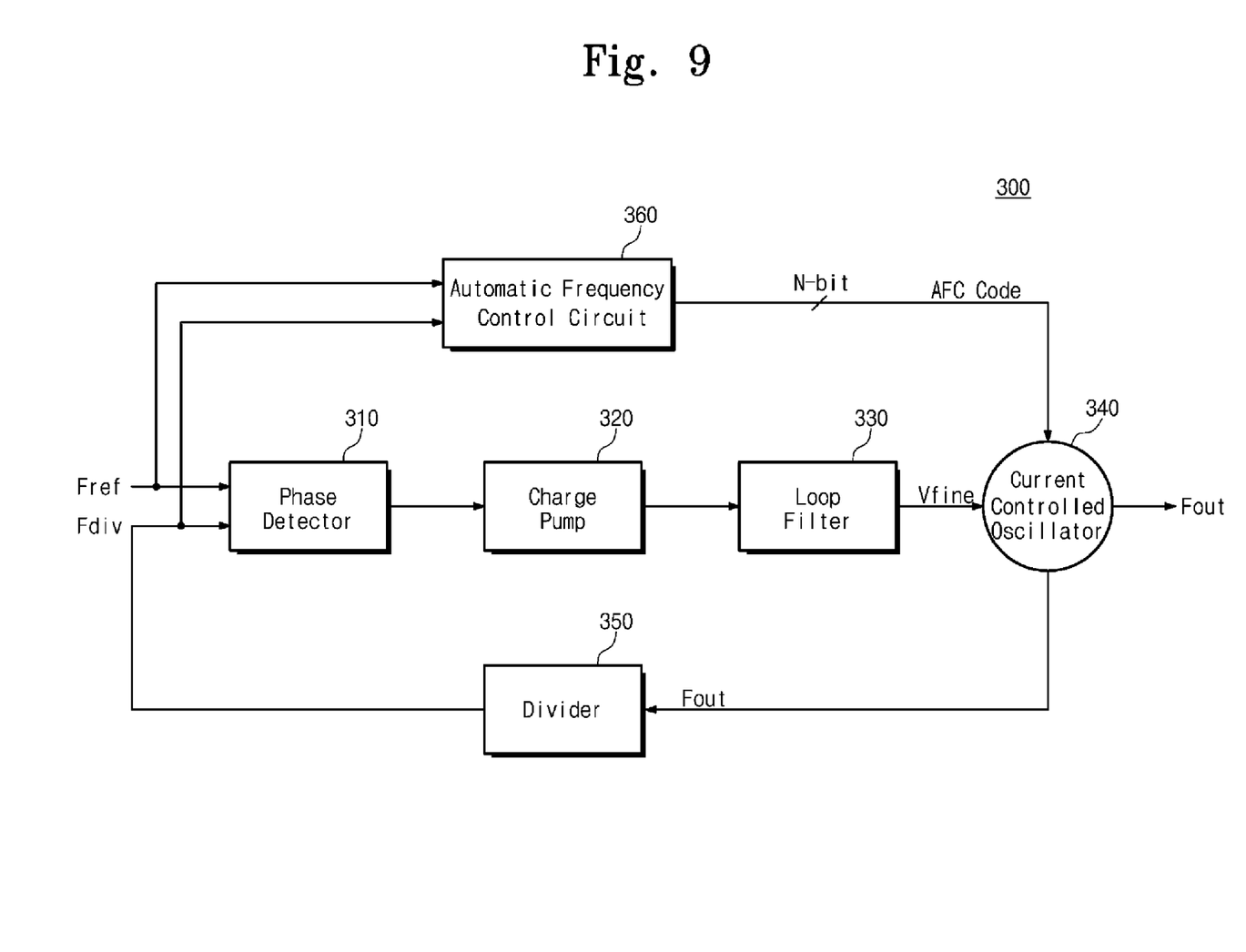
FIG. 9 is a block diagram exemplarily illustrating a PLL circuit according to a third embodiment of the present invention.

FIG. 9 is a block diagram exemplarily illustrating a PLL circuit according to a third embodiment of the present invention.

Referring to FIG. 9, a PLL circuit 300 according to a third embodiment of the present invention includes a phase detector 310, a charge pump 320, a loop filter 330, a current controlled oscillator 340, a divider 350, and an automatic frequency control circuit 360. Except for the current controlled oscillator 340 and the automatic frequency control circuit 260, the functions and operations of the respective elements are the same as the described of a first embodiment of the present invention.

The PLL circuit 300 according to a third embodiment of the present invention includes a bias current bank for outputting an oscillation signal Fout having a broad frequency. The bias current bank may be included in the current controlled oscillator 340. The PLL circuit 300 including the bias current bank includes the automatic frequency control circuit 360, for outputting an oscillation signal Fout having a stable frequency even when an input reference frequency signal Fref is changed.

The current controlled oscillator 340 according to a third embodiment of the present invention outputs the oscillation signal Fout in response to an AFC code provided from the automatic frequency control circuit 360. The current controlled oscillator 340 is primarily controlled by the AFC code, and is secondarily controlled by the output voltage Vfine of the loop filter 330. The current controlled oscillator 340 outputs a coarsely-tuned oscillation signal Fout when primarily controlled, and outputs a finely-tuned oscillation signal Fout when secondarily controlled.

The automatic frequency control circuit 360 generates an AFC code for controlling the bias current bank of the current controlled oscillator 340. The automatic frequency control circuit 360 executes a successive approximation algorithm for generating the AFC code. The successive approximation algorithm according to a third embodiment of the present invention may be an algorithm that determines the bias current of the current controlled oscillator 340 in order for the frequency of a divided oscillation signal Fdiv to coarsely be synchronized with the frequency of a reference frequency signal Fref.

According to a third embodiment of the present invention, the PLL circuit 300 can output an oscillation signal having a quick frequency fixing time and a broad and stable frequency. Also, even when the frequency of a reference frequency signal is changed, a frequency can be fixed by the operation of the automatic frequency control circuit 360 irrespective of the dividing ratio of the divider 350.

The PLL circuit according to embodiments of the present invention includes the automatic frequency control circuit capable of a quick operation, and thus fixing of an arbitrary output frequency can be achieved in an early time. Moreover, the PLL circuit according to embodiments of the present invention has a broad output frequency range.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A Phase Locked Loop (PLL) circuit comprising:
   a voltage controlled oscillator comprising an adjustable capacitor and a capacitor bank, and configured to output an output signal having an arbitrary frequency;
   a loop filter configured to output a control voltage for controlling a capacitance of the adjustable capacitor; and
   an automatic frequency control circuit configured to receive a signal having a reference frequency and a divided signal of the output signal of the voltage controlled oscillator, generate pulse width signals of the two received signals, convert the pulse width signals into voltage values, and generate a control code for controlling a capacitance of the capacitor bank by comparing the voltage values,
   wherein the voltage controlled oscillator is configured to generate the output signal synchronized with a target frequency according to the capacitance of the adjustable capacitor controlled by the control voltage and the capacitance of the capacitor bank controlled by the control code.

2. The Phase Locked Loop (PLL) circuit of claim 1, wherein the automatic frequency control circuit comprises:
   a pulse width generator configured to generate first and second pulse width signals corresponding to the signal having the reference frequency and the divided signal per set periods of the two received signals, respectively;
   a pulse width-to-voltage converter configured to convert the first and second pulse width signals into first and second voltage values, respectively;
   a comparator configured to compare the first voltage value with the second voltage value;
   a control logic configured to generate the control code according to a comparison result of the comparator; and
   a successive approximation register configured to store the control code or temporarily change the control code according to control of the control logic.

3. The Phase Locked Loop (PLL) circuit of claim 2, wherein the pulse width generator is configured to receive the signal having the reference frequency and the divided signal of the output signal of the voltage controlled oscillator, and activate the first and second pulse width signals.

4. The Phase Locked Loop (PLL) circuit of claim 3, wherein the automatic frequency control circuit further comprises: a logic gate configured to activate a control signal for operating the comparator according to the first and second pulse width signals.

5. The Phase Locked Loop (PLL) circuit of claim 2, wherein the successive approximation register comprises:
a register storing the control code; and
a switch logic configured to temporarily change the control code.

6. The Phase Locked Loop (PLL) circuit of claim 2, wherein the pulse width-to-voltage converter comprises:
a first pulse width-to-voltage converter configured to convert the first pulse width signal into the first voltage value; and
a second pulse width-to-voltage converter configured to convert the second pulse width signal into the second voltage value,
wherein each of the first and second pulse width-to-voltage converters comprises:
a first switch coupled to and disposed between a power source voltage and an output terminal of the pulse width-to-voltage converter, and controlled by an inverted signal of the pulse width signal;
a second switch coupled to and disposed between the output terminal and a current source, and controlled by the pulse width signal; and
a capacitor coupled to and disposed between the output terminal and a ground,
wherein the capacitor is charged with the power source voltage when the first switch is turned on, and when the second switch is turned on, an electric charge charged in the capacitor is discharged through the current source.

7. The Phase Locked Loop (PLL) circuit of claim 1, wherein the capacitor bank comprises:
a plurality of capacitors; and
a plurality of switches respectively coupled to the capacitors.

8. The Phase Locked Loop (PLL) circuit of claim 7, wherein the switches of the capacitor bank respectively disconnect the capacitors from an output terminal of the voltage controlled oscillator or respectively connect the capacitors to the output terminal of the voltage controlled oscillator, according to the control code.

9. A Phase Locked Loop (PLL) circuit comprising:
a voltage controlled oscillator configured to generate an output signal having an arbitrary frequency;
a loop filter configured to output a control voltage for controlling a frequency of the output signal from the voltage controlled oscillator;
a regulator configured to generate an output voltage in response to a control code and supply the output voltage to the voltage controlled oscillator; and
an automatic frequency control circuit configured to receive a signal having a reference frequency and a divided signal of the output signal of the voltage controlled oscillator, and generate the control code for controlling the output voltage from the regulator,
wherein the voltage controlled oscillator is configured to be primarily controlled by the output voltage from the regulator, be secondarily controlled by the control voltage, and generate the output signal synchronized with a target frequency.

10. The Phase Locked Loop (PLL) circuit of claim 9, wherein the automatic frequency control circuit comprises:
a pulse width generator configured to generate first and second pulse width signals corresponding to the signal having the reference frequency and the divided signal per set periods, respectively;
a pulse width-to-voltage converter configured to convert the first and second pulse width signals into first and second voltage values, respectively;
a comparator configured to compare the first voltage value with the second voltage value;
a control logic configured to generate the control code according to the comparison result of the comparator; and
a successive approximation register configured to store the control code or temporarily change the control code according to control of the control logic.

11. The Phase Locked Loop (PLL) circuit of claim 10, wherein the pulse width generator is configured to receive the signal having the reference frequency and the divided signal of the output signal of the voltage controlled oscillator, and activate the first and second pulse width signals.

12. The Phase Locked Loop (PLL) circuit of claim 11, wherein the automatic frequency control circuit further comprises: a logic gate configured to activate a control signal for operating the comparator according to the first and second pulse width signals.

13. The Phase Locked Loop (PLL) circuit of claim 10, wherein the successive approximation register comprises:
a register storing the control code; and
a switch logic configured to temporarily change the control code.

14. The Phase Locked Loop (PLL) circuit of claim 10, wherein the pulse width-to-voltage converter comprises:
a first pulse width-to-voltage converter configured to convert the first pulse width signal into the first voltage value; and
a second pulse width-to-voltage converter configured to convert the second pulse width signal into the second voltage value,
wherein each of the first and second pulse width-to-voltage converters comprises:
a first switch coupled to and disposed between a power source voltage and an output terminal of the pulse width-to-voltage converter, and controlled by an inverted signal of the pulse width signal;
a second switch coupled to and disposed between the output terminal and a current source, and controlled by the pulse width signal; and
a capacitor coupled to and disposed between the output terminal and a ground,
wherein the capacitor is charged with the power source voltage when the first switch is turned on, and when the second switch is turned on, an electric charge charged in the capacitor is discharged through the current source.

15. An operating method of a Phase Locked Loop (PLL) circuit, the operating method comprising:
receiving a signal having a reference frequency and an output signal of a voltage controlled oscillator, and generating first and second pulse width signals corresponding to the two received signals, respectively;
converting the first and second pulse width signals into first and second voltage signals, respectively;
comparing levels of the first and second voltage signals;
generating a control code according to the result of the comparing of the levels;
receiving the signal having the reference frequency and the output signal of the voltage controlled oscillator, and generating a control voltage according to a phase difference between the two received signals; and generating an output signal synchronized with a target frequency, in response to the control code and the control voltage.

16. The operating method of claim 15, wherein the generating of the output signal comprises:
   determining a load capacitance of the voltage controlled oscillator according to a capacitance controlled by the control code and a capacitance controlled by the control voltage; and
   generating the output signal synchronized with the target frequency according to the load capacitance.

17. The operating method of claim 15, wherein the generating of the first and second pulse width signals comprises generating activated signals per set periods of the two received signals, respectively.

18. The operating method of claim 17, wherein the converting of the first and second pulse width signals comprises outputting a power source voltage during a deactivated section of each of the first and second pulse width signals, and outputting a voltage that decreases at a certain speed during an activated section of each of the first and second pulse width signals.

19. The operating method of claim 15, wherein the generating of the control code comprises:
   generating a temporary control code for temporarily setting a capacitance; and
   changing the temporary control code according to the result of the comparing of the levels.

20. The operating method of claim 19, wherein the generating of the control code comprises sequentially generating the control code by one bit.

* * * * *